US009953658B2

(12) United States Patent
Li

(10) Patent No.: US 9,953,658 B2
(45) Date of Patent: Apr. 24, 2018

(54) DATA DECODING METHOD AND APPARATUS

(71) Applicant: TENDYRON CORPORATION, Beijing (CN)

(72) Inventor: Dongsheng Li, Beijing (CN)

(73) Assignee: TENDYRON CORPORATION, Beijing (CN)

( * ) Notice: Subject to any disclaimer, the term of this patent is extended or adjusted under 35 U.S.C. 154(b) by 0 days.

(21) Appl. No.: 15/127,731

(22) PCT Filed: Jan. 15, 2015

(86) PCT No.: PCT/CN2015/070736
§ 371 (c)(1),
(2) Date: Sep. 20, 2016

(87) PCT Pub. No.: WO2015/139523
PCT Pub. Date: Sep. 24, 2015

(65) Prior Publication Data
US 2017/0140767 A1  May 18, 2017

(30) Foreign Application Priority Data
Mar. 21, 2014  (CN) .......................... 2014 1 0108273
Mar. 21, 2014  (CN) .......................... 2014 1 0108461

(51) Int. Cl.
*G10L 19/00* (2013.01)
*G10L 19/025* (2013.01)
(Continued)

(52) U.S. Cl.
CPC .......... *G10L 19/025* (2013.01); *G10L 19/008* (2013.01); *G10L 19/22* (2013.01);
(Continued)

(58) Field of Classification Search
USPC ........................................................... 704/9
See application file for complete search history.

(56) References Cited

U.S. PATENT DOCUMENTS

2004/0264713 A1  12/2004  Grzesek

FOREIGN PATENT DOCUMENTS

CN  101247183 A  8/2008
CN  103248434 A  8/2013
(Continued)

OTHER PUBLICATIONS

International Search Report issued in PCT/CN2015/070736 dated Mar. 30, 2015 (2 pages).
(Continued)

*Primary Examiner* — Vu B Hang
(74) *Attorney, Agent, or Firm* — Osha Liang LLP

(57) ABSTRACT

A data decoding method and device as well as an intelligent cipher key token are provided. The data decoding method includes: receiving a sinusoidal wave via an audio interface, wherein the sinusoidal wave has a waveform with at least one period, and different periods represent different bit values; processing the sinusoidal wave so as to obtain a first square wave, wherein the first square wave carries data to be decoded; determining whether there is a glitch waveform in the first square wave, based on a preset threshold or based on an adaptive threshold, wherein the adaptive threshold is calculated according to synchronization head data carried in the sinusoidal wave; if there is a glitch waveform in the first square wave, eliminating the glitch waveform from the first square wave so as to obtain a second square wave; and decoding the second square wave so as to obtain decoded data.

18 Claims, 6 Drawing Sheets

(51) Int. Cl.
  *G10L 19/22*   (2013.01)
  *G10L 19/008*  (2013.01)
  *G10L 19/005*  (2013.01)
  *G10L 21/038*  (2013.01)
  *G10L 21/0208* (2013.01)
  *G10L 25/30*   (2013.01)

(52) U.S. Cl.
  CPC ........ *G10L 19/005* (2013.01); *G10L 21/0208* (2013.01); *G10L 21/038* (2013.01); *G10L 25/30* (2013.01)

(56) References Cited

FOREIGN PATENT DOCUMENTS

| CN | 103888107 A | 6/2014 |
|----|-------------|--------|
| CN | 103888108 A | 6/2014 |

OTHER PUBLICATIONS

Written Opinion of the International Searching Authority issued in PCT/CN2015/070736 dated Mar. 30, 2015 (3 pages).

DATA DECODING METHOD AND APPARATUS

CROSS-REFERENCE TO RELATED APPLICATIONS

This application is a U.S. national phase application of International Application No. PCT/CN2015/070736, filed with the State Intellectual Property Office of P. R. China on Jan. 15, 2015, which is based upon and claims priority to Chinese Patent Application Nos. 201410108273.8 and 201410108461.0, filed with the State Intellectual Property Office of P. R. China on Mar. 21, 2014, the entire contents of which are incorporated herein by reference.

FIELD

The present disclosure relates to electronic technology field, and more particularly to a data decoding method and device, as well as an intelligent cipher key token.

BACKGROUND

An intelligent cipher key token (e.g. an audio key, a USBKEY) supporting an audio interface may realize a data interaction with an external terminal (e.g. a cellphone) via the audio interface by adopting an audio signal. The audio signal is a kind of analog signal, during the transmission of which, a waveform distortion problem may occur. When the intelligent cipher key token receives data transmitted via the audio signal and if audio signal has the waveform distortion problem, an error may occur during the data decoding process, such that an accuracy of the data decoding is reduced, or even a failure may occur on the data decoding.

In the related art, there is not such a data decoding solution that may improve the accuracy and a success rate of the data decoding process performed when the intelligent cipher key token receives the audio signal from the external terminal.

SUMMARY

The present disclosure aims to solve the above problems.

In an implementation, the present disclosure aims to provide a data decoding method.

In another implementation, the present disclosure aims to provide a data decoding device.

In yet another implementation, the present disclosure aims to provide another data decoding method.

In still yet another implementation, the present disclosure aims to provide yet another data decoding method.

In still yet another implementation, the present disclosure aims to provide an intelligent cipher key token.

To achieve the above objectives, the technical solutions of the present disclosure are realized as follows.

According to a first aspect of the present disclosure, a data decoding method is provided. The data decoding method includes: receiving a sinusoidal wave via an audio interface, in which the sinusoidal wave has a waveform with at least one period, and different periods represent different bit values; processing the sinusoidal wave so as to obtain a first square wave, in which the first square wave carries data to be decoded; determining whether there is a glitch waveform in the first square wave, based on a preset threshold or based on an adaptive threshold, in which the adaptive threshold is calculated according to synchronization head data carried in the sinusoidal wave; if there is a glitch waveform in the first square wave, eliminating the glitch waveform from the first square wave so as to obtain a second square wave; and decoding the second square wave so as to obtain decoded data.

The method further includes: if there is no glitch waveform in the first square wave, decoding the first square wave so as to obtain the decoded data.

The adaptive threshold is calculated by $P=i\times Q$, where, P is the adaptive threshold, Q is a width of a waveform representing the synchronization head data, and i is a preset percentage.

Determining whether there is a glitch waveform in the first square wave based on a preset threshold includes: determining whether there is a waveform with a width less than the preset threshold in the first square wave, if there is a waveform with a width less than the preset threshold in the first square wave, determining that there is a glitch waveform in the first square wave; and if there is no waveform with a width less than the preset threshold in the first square wave, determining that there is no glitch waveform in the first square wave.

Determining whether there is a glitch waveform in the first square wave based on an adaptive threshold includes: determining whether there is a waveform with a width less than the adaptive threshold in the first square wave, if there is a waveform with a width less than the adaptive threshold in the first square wave, determining that there is a glitch waveform in the first square wave; and if there is no waveform with a width less than the adaptive threshold in the first square wave, determining that there is no glitch waveform in the first square wave.

Eliminating the glitch waveform from the first square wave includes: if a level of the glitch waveform is high, reversing the level of the glitch waveform to be low; and if a level of the glitch waveform is low, reversing the level of the glitch waveform to be high.

According to a second aspect of the present disclosure, a data decoding device is provided. The data decoding device includes: a sending module, configured to receive a sinusoidal wave via an audio interface, in which the sinusoidal wave has a waveform with at least one period, and different periods represent different bit values; a waveform processing module, configured to process the sinusoidal wave so as to obtain a first square wave, in which the first square wave carries data to be decoded; a determining module, configured to determine whether there is a glitch waveform in the first square wave, based on a preset threshold or based on an adaptive threshold, in which the adaptive threshold is calculated according to synchronization head data carried in the sinusoidal wave; a glitch processing module, configured to eliminate a glitch waveform from the first square wave so as to obtain a second square wave, if there is the glitch waveform in the first square wave; and a decoding module, configured to decode the second square wave so as to obtain decoded data.

The decoding module is further configured to decode the first square wave so as to obtain the decoded data if there is no glitch waveform in the first square wave.

The determining module is configured to determine whether there is a waveform with a width less than the preset threshold in the first square wave, to determine that there is a glitch waveform in the first square wave if there is a waveform with a width less than the preset threshold in the first square wave, and to determine that there is no glitch waveform in the first square wave if there is no waveform with a width less than the preset threshold in the first square wave.

The determining module is configured to determine whether there is a waveform with a width less than the adaptive threshold in the first square wave, to determine that there is a glitch waveform in the first square wave if there is a waveform with a width less than the adaptive threshold in the first square wave, and to determine that there is no glitch waveform in the first square wave if there is no waveform with a width less than the adaptive threshold in the first square wave.

The adaptive threshold is calculated by $P=i \times Q$, where, P is the adaptive threshold, Q is a width of a waveform representing the synchronization head data, and i is a preset percentage.

The glitch processing module is configured to reverse a level of the glitch waveform to be low if the level of the glitch waveform is high; and to reverse a level of the glitch waveform to be high if the level of the glitch waveform is low.

According to the above technical solutions of the present disclosure, the present disclosure provides a data decoding method and device, which processes the sinusoidal wave received via the audio interface to the square wave, detects the glitch waveform in the square wave, eliminates the glitch waveform from the square wave when detecting the glitch waveform (i.e., the distortion waveform), and performs the data decoding on the square wave obtained after eliminating the glitch waveform. That is, if there is a glitch waveform in the square wave, the glitch waveform is eliminated, such that an error caused by a waveform distortion is eliminated, and the data decoding is performed on the square wave obtained after eliminating the glitch waveform, thus reducing the error rate of the data decoding caused by the waveform distortion, and improving the accuracy and success rate of the data decoding in the intelligent cipher key token.

According to a third aspect of the present disclosure, another data decoding method is provided. The method includes following steps.

In step A, a sinusoidal wave is received via an audio interface, the sinusoidal wave is processed to square waves carrying data to be decoded, and the square waves carrying data to be decoded are spliced to a first square wave, in which, the sinusoidal wave has a waveform with at least one period, and different periods represent different bit values.

In step B, it is determined whether the first square wave includes a preset number of continuous waveforms with the same period.

If the first square wave includes the preset number of continuous waveforms with the same period, it is determined that the first square wave carries synchronization head data, and step E is executed; and/or if the first square wave does not include the preset number of continuous waveforms with the same period, it is determined that the first square wave does not carry the synchronization head data, and then it is determined whether there is a glitch waveform in the first square wave based on a preset threshold.

If there is no glitch waveform in the first square wave, step A is executed; and/or if there is glitch waveform in the first square wave, step C is executed.

In step C, the glitch waveform is eliminated from the first square wave so as to obtain a second square wave.

In step D, it is determined whether the second square wave includes a preset number of continuous waveforms with the same period.

If the second square wave includes the preset number of continuous waveforms with the same period, it is determined that the second square wave carries synchronization head data, and step E is executed; and/or if the second square wave does not include the preset number of continuous waveforms with the same period, it is determined that the second square wave does not carry the synchronization head data, and step A is executed.

In step E, an adaptive threshold is calculated according to the synchronization head data. If the previous step is step B, step F1 is executed; and if the previous step is step D, step F1 or F2 is executed.

In step F1, it is determined whether there is the glitch waveform in the first square wave based on the adaptive threshold, and step G1 is executed.

In step F2, it is determined whether there is the glitch waveform in the second square wave based on the adaptive threshold, and step G2 is executed.

In step G1, if there is the glitch waveform in the first square wave, the glitch waveform is eliminated from the first square wave so as to obtain a third square wave, and the third square wave is decoded so as to obtain decoded data; and/or if there is no glitch waveform in the first square wave, the first square wave is decoded so as to obtain decoded data.

In step G2, if there is the glitch waveform in the second square wave, the glitch waveform is eliminated from the second square wave so as to obtain a fourth square wave, and the fourth square wave is decoded so as to obtain decoded data; and/or if there is no glitch waveform in the second square wave, the second square wave is decoded so as to obtain decoded data.

The method further includes following steps.

In step H, it is determined whether there is synchronization tail data in the decoded data.

If there is synchronization tail data in the decoded data, the decoded data is processed.

If there is no synchronization tail data in the decoded data, step I is executed.

In step I, a next set of square waves to be processed is processed.

In step J, it is determined whether there is a glitch waveform in the next set of square waves to be processed based on the adaptive threshold.

If there is a glitch waveform in the next set of square waves to be processed, the glitch waveform is eliminated from the next set of square waves to be processed, and the square waves obtained after eliminating the glitch waveform are decoded to obtain decoded data, and then step H is executed.

If there is no glitch waveform in the next set of square waves to be processed, the next set of square waves is decoded so as to obtain decoded data, and step H is executed.

Calculating the adaptive threshold according to the synchronization head data includes:

calculating the adaptive threshold by $P=i \times Q$, where, P is the adaptive threshold, Q is a width of a waveform representing the synchronization head data, and i is a preset percentage.

An implementation method of determining whether there is a glitch waveform based on a preset threshold includes:

determining whether there is a waveform with a width less than the preset threshold, if there is a waveform with a width less than the preset threshold, determining that there is a glitch waveform; and if there is no waveform with a width less than the preset threshold, determining that there is no glitch waveform.

An implementation method of determining whether there is a glitch waveform based on an adaptive threshold includes:

determining whether there is a waveform with a width less than the adaptive threshold, if there is a waveform with a width less than the adaptive threshold, determining that there is a glitch waveform; and if there is no waveform with a width less than the adaptive threshold, determining that there is no glitch waveform.

An implementation method of eliminating the glitch waveform includes:

if a level of the glitch waveform is high, reversing the level of the glitch waveform to be low; and if a level of the glitch waveform is low, reversing the level of the glitch waveform to be high.

According to a fourth aspect of the present disclosure, yet another data decoding method is provided. The method includes following steps.

In step S1, a sinusoidal wave is received via an audio interface, the sinusoidal wave is processed to square waves carrying data to be decoded, and the square waves carrying data to be decoded are spliced to a first square wave, in which, the sinusoidal wave has a waveform with at least one period, and different periods represent different bit values.

In step S2, it is determined whether the first square wave includes a preset number of continuous waveforms with the same period.

If the first square wave includes a preset number of continuous waveforms with the same period, it is determined that the first square wave carries synchronization head data, and step S5 is executed; and/or if the first square wave does not include the preset number of continuous waveforms with the same period, it is determined that the first square wave does not carry the synchronization head data, and then it is determined whether there is a glitch waveform in the first square wave based on a preset threshold.

If there is no glitch waveform in the first square wave, step S1 is executed; and/or if there is glitch waveform in the first square wave, step S3 is executed.

In step S3, the glitch waveform is eliminated from the first square wave so as to obtain a second square wave.

In step S4, it is determined whether the second square wave includes a preset number of continuous waveforms with the same period.

If the second square wave includes the preset number of continuous waveforms with the same period, it is determined that the second square wave carries synchronization head data, and step S5 is executed; and/or if the second square wave does not include the preset number of continuous waveforms with the same period, it is determined that the second square wave does not carry the synchronization head data, and step S1 is executed.

In step S5, an adaptive threshold is calculated according to the synchronization head data. If the previous step is step S2, step S6-1 is executed, and if the previous step is step S4, step S6-1 or S6-2 is executed.

In step S6-1, it is determined whether there is the glitch waveform in the first square wave based on the adaptive threshold, and step S7-1 is executed.

In step S6-2, it is determined whether there is the glitch waveform in the second square wave based on the adaptive threshold, and step S7-2 is executed.

In step S7-1, if there is the glitch waveform in the first square wave, the glitch waveform is eliminated from the first square wave so as to obtain a third square wave, the third square wave is saved, and step S8 is executed; and/or if there is no glitch waveform in the first square wave, the first square wave is saved, and step S8 is executed.

In step S7-2, if there is the glitch waveform in the second square wave, the glitch waveform is eliminated from the second square wave so as to obtain a fourth square wave, the fourth square wave is saved, and step S8 is executed; and/or if there is no glitch waveform in the second square wave, the second square wave is saved, and step S8 is executed.

In step S8, it is determined whether there is synchronization tail data in the square wave saved.

In step S9-1, if there is synchronization tail data in the square wave saved, the square wave saved is decoded.

The method further includes following steps after step S8.

In step S9-2, if there is no synchronization tail data in the square wave saved, a next set of square waves to be processed is obtained, and it is determined whether there is a glitch waveform in the next set of square waves to be processed based on the adaptive threshold.

If there is a glitch waveform in the next set of square waves to be processed, the glitch waveform is eliminated from the next set of square waves to be processed, the waveform obtained after eliminating the glitch waveform is saved, and step S8 is executed.

If there is no glitch waveform in the next set of square waves to be processed, the next set of square waves is saved, and step S8 is executed.

Calculating the adaptive threshold according to the synchronization head data includes:

calculating the adaptive threshold by $P=i \times Q$, where, P is the adaptive threshold, Q is a width of a waveform representing the synchronization head data, and i is a preset percentage.

An implementation method of determining whether there is a glitch waveform based on a preset threshold includes:

determining whether there is a waveform with a width less than the preset threshold, if there is a waveform with a width less than the preset threshold, determining that there is a glitch waveform; and if there is no waveform with a width less than the preset threshold, determining that there is no glitch waveform.

An implementation method of determining whether there is a glitch waveform based on an adaptive threshold includes:

determining whether there is a waveform with a width less than the adaptive threshold, if there is a waveform with a width less than the adaptive threshold, determining that there is a glitch waveform; and if there is no waveform with a width less than the adaptive threshold, determining that there is no glitch waveform.

An implementation method of eliminating the glitch waveform includes:

if a level of the glitch waveform is high, reversing the level of the glitch waveform to be low; and if a level of the glitch waveform is low, reversing the level of the glitch waveform to be high.

According to a third aspect of the present disclosure, an intelligent cipher key token is provided. The intelligent cipher key token includes an audio interface and a processor. The audio interface is configured to receive a sinusoidal wave, in which the sinusoidal wave has a waveform with at least one period, and different periods represent different bit values. The processor is configured to: process the sinusoidal wave so as to obtain a first square wave, wherein the first square wave carries data to be decoded; determine whether there is a glitch waveform in the first square wave, based on a preset threshold or based on an adaptive threshold, wherein the adaptive threshold is calculated according to synchronization head data carried in the sinusoidal wave; if there is a glitch waveform in the first square wave, eliminate the glitch waveform from the first square wave so as to obtain a second square wave; and decode the second square wave so as to obtain decoded data.

In at least one embodiment, the processor is further configured to decode the first square wave so as to obtain the decoded data, if there is no glitch waveform in the first square wave.

In at least one embodiment, the adaptive threshold is calculated by P=i×Q, where, P is the adaptive threshold, Q is a width of a waveform representing the synchronization head data, and i is a preset percentage.

In at least one embodiment, the processor is specifically configured to: determine whether there is a waveform with a width less than the preset threshold in the first square wave; if there is a waveform with a width less than the preset threshold in the first square wave, determine that there is a glitch waveform in the first square wave; and if there is no waveform with a width less than the preset threshold in the first square wave, determine that there is no glitch waveform in the first square wave.

In at least one embodiment, the processor is specifically configured to: determine whether there is a waveform with a width less than the adaptive threshold in the first square wave; if there is a waveform with a width less than the adaptive threshold in the first square wave, determine that there is a glitch waveform in the first square wave; and if there is no waveform with a width less than the adaptive threshold in the first square wave, determine that there is no glitch waveform in the first square wave.

In at least one embodiment, the processor is specifically configured to: if a level of the glitch waveform is high, reverse the level of the glitch waveform to be low; and if a level of the glitch waveform is low, reverse the level of the glitch waveform to be high.

It can be seen from the above technical solutions of the present disclosure that, with using any one of the data decoding methods provided in the third aspect and the fourth aspect of the present disclosure, the sinusoidal wave received via the audio interface is processed to a square wave, and it is detected whether there is a glitch waveform in the square wave based on the preset threshold or based on the adaptive threshold, if the glitch waveform is detected, the glitch waveform is regarded as the distortion waveform and eliminated from the square wave, and then the data decoding is performed on the square wave obtained after eliminating the glitch waveform. That is, if there is a glitch waveform in the square wave, the glitch waveform is eliminated so as to eliminate an error caused by a waveform distortion, and the data decoding is performed on the square wave obtained after eliminating the glitch waveform, such that an error rate of the data decoding caused by the waveform distortion is reduced, and the accuracy and success rate of the data decoding in the intelligent cipher key token is improved.

BRIEF DESCRIPTION OF THE DRAWINGS

In order to make technique solutions according to embodiments of the present disclosure more apparent, drawings needed to be used in descriptions of the embodiments will be illustrated in the following. Obviously, the drawings to be illustrated in the following only represent some embodiments of the present disclosure, and other drawings can be obtained according these drawings by those having ordinary skills in the related art without making creative labors.

DETAILED DESCRIPTION

The technique solution in embodiments of the present disclosure will be described in the following with reference to drawings in the embodiments of the present disclosure. Obviously, the embodiments to be described only are some embodiments of the present disclosure, instead of all the embodiments thereof. Based on embodiments of the present disclosure, other embodiments obtained by those having ordinary skills in the related art without making creative labors fall into a protection scope of the present disclosure.

In the description of the present disclosure, unless specified or limited otherwise, it should be noted that, terms "mounted," "connected" and "coupled" may be understood broadly, such as permanent connection or detachable connection, electronic connection or mechanical connection, direct connection or indirect connection via intermediary, inner communication or interaction between two elements. These having ordinary skills in the art should understand the specific meanings in the present disclosure according to specific situations. In addition, terms such as "first" and "second" are used herein for purposes of description and are not intended to indicate or imply relative importance or significance.

In the following, embodiments of the present disclosure will be further described in detail with reference to drawings.

The term "period" is defined as follows. One period indicates a time width between adjacent rising edges of a waveform or a time width between adjacent falling edges of a waveform.

Embodiment 1

Figure 1:
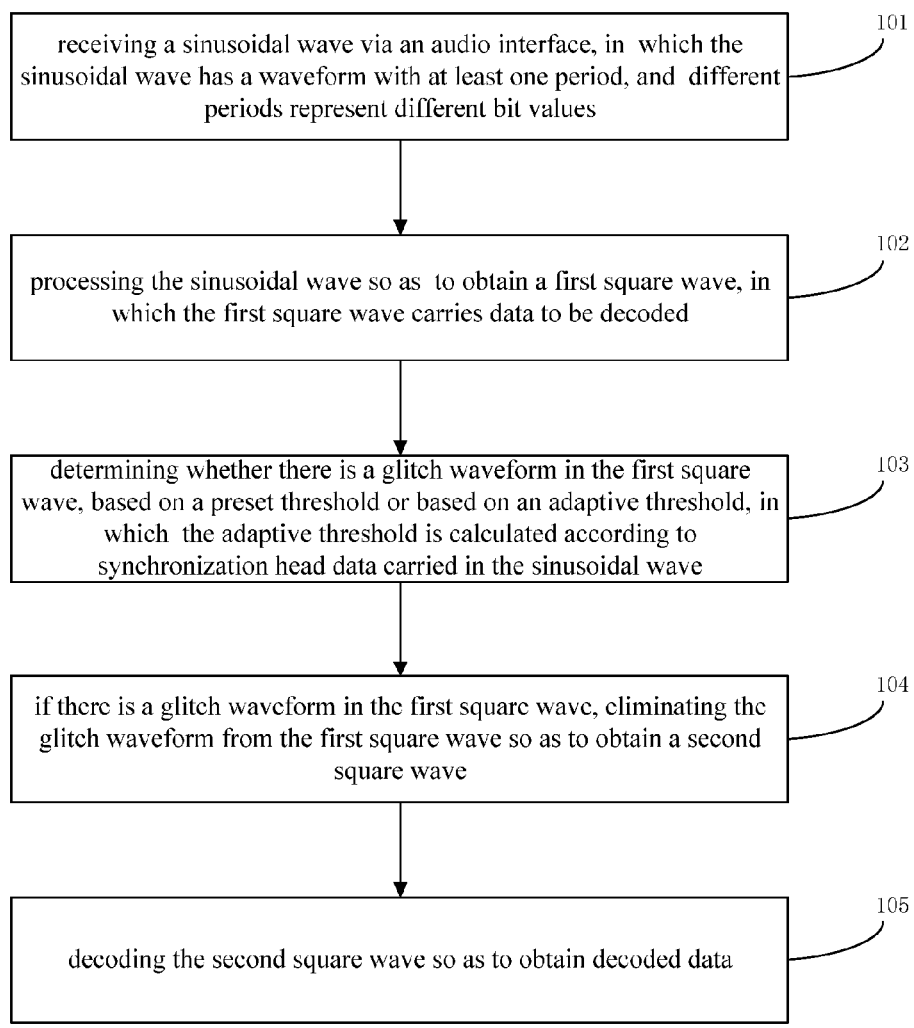
FIG. 1 is a flow chart of a data decoding method according to Embodiment 1 of the present disclosure.

A data decoding method is provided in this embodiment, and as shown in FIG. 1, the method mainly includes steps 101-105 as follows.

In step 101, a sinusoidal wave is received via an audio interface, in which the sinusoidal wave has a waveform with at least one period, and different periods represent different bit values.

The intelligent cipher key token supporting an audio interface receives the sinusoidal wave sent by an external terminal (e.g. a cellphone, a tablet and etc.) via the audio interface. The sinusoidal wave is used to transmit data, and different periods in the sinusoidal wave represent different bit values. For example, the sinusoidal wave with period T1 is used to transmit bit value 1, and the sinusoidal wave with period T0 is used to transmit bit value 0.

In step 102, the sinusoidal wave is processed to a first square wave, in which the first square wave carries data to be decoded.

In step 103, it is determined whether there is a glitch waveform in the first square wave, based on a preset threshold or based on an adaptive threshold, in which the adaptive threshold is calculated according to synchronization head data carried in the sinusoidal wave.

Alternatively, the present step may be implemented by determining whether there is a glitch waveform in the first square wave based on a preset threshold, i.e. determining whether there is a waveform with a width less than the preset threshold in the first square wave. If there is a waveform with a width less than the preset threshold in the first square wave, it is determined that there is a glitch waveform in the first square wave; and if there is no waveform with a width less than the preset threshold in the first square wave, it is determined that there is no glitch waveform in the first square wave.

Specifically, a width between a rising edge and an adjacent falling edge in the first square wave or a width between a falling edge and an adjacent rising edge in the first square wave is detected and the width detected is compared with the preset threshold. If there is a width less than the preset threshold, it is determined that there is a glitch waveform in the first square wave, and if there is no width less than the preset threshold, it is determined that there is no glitch waveform in the first square wave.

Alternatively, the present step may also be implemented by determining whether there is a glitch waveform in the first square wave based on an adaptive threshold, in which the adaptive threshold is calculated according to synchronization head data carried in the sinusoidal wave.

Specifically, a width between a rising edge and an adjacent falling edge in the first square wave or a width between a falling edge and an adjacent rising edge in the first square wave is detected, and the width detected is compared with the adaptive threshold. If there is a width less than the adaptive threshold, it is determined that there is a glitch waveform in the first square wave, and if there is no width less than the adaptive threshold, it is determined that there is no glitch waveform in the first square wave.

In the present embodiment, when the intelligent cipher key token performs a data interaction with the external terminal, a data structure used may at least include: synchronization head data, data to be transmitted, and synchronization tail data. The synchronization head data may include a preset number of continuous bit values, and is represented as a preset number of continuous waveforms with the same period in the square wave. For example, the synchronization head data may include eight continuous bits of 1, and the period T1 represents bit 1, and then the synchronization head data may be represented as eight continuous waveforms with period T1 in the square wave. The synchronization tail data may also include a preset number of continuous bit values, and is represented as a preset number of continuous waveforms with the same period in the square wave. However, the bit value representing the synchronization head data is different from that representing the synchronization tail data, and in the square wave, waveforms with different periods are used. For example, the synchronization tail data includes six continuous bits of 0, and the period T0 represents bit 0, and then the synchronization tail data is represented as six continuous waveforms with period T0 in the square wave.

Thus, before performing the data interaction with the external terminal, the intelligent cipher key token may negotiate with the external terminal through handshake sessions for obtaining a specific format used for transmitting the data. For example, the intelligent cipher key token may obtain the format used for transmitting the data as follows: the synchronization head data including 8 continuous bits of 1, the data to be transmitted, and the synchronization tail data including 6 continuous bits of 0 in sequence. If the intelligent cipher key token determines that the square wave includes 8 continuous waveforms with the same period T1, it may be determined that the square wave carries the synchronization head data.

The adaptive threshold is calculated by $P=i \times Q$, where, P is the adaptive threshold, Q is a width of a waveform representing the synchronization head data, and i is a preset percentage.

For example, the value of i may be specifically set according to various requirements for actual applications, e.g. may be 5%. Take the width of the waveform representing the synchronization head data being 30 as an example, the adaptive threshold is 30*5%=1.5.

In the present embodiment, if the width of the waveform in the square wave changes, the width of the glitch waveform existing in the square wave may also change. In the present disclosure, the adaptive threshold is calculated according to the width of the waveform representing the synchronization head data, such that it may reflect the width of the glitch waveform existing in the square wave more actually and accurately. Therefore, by determining whether there is a glitch waveform based on the adaptive threshold, the accuracy of detecting a glitch waveform will be further improved.

Specifically, an implementation method of determining whether there is a glitch waveform in the first square wave based on an adaptive threshold includes: determining whether there is a waveform with a width less than the adaptive threshold in the first square wave; if there is a waveform with a width less than the adaptive threshold in the first square wave, determining that there is a glitch waveform in the first square wave; and if there is no waveform with a width less than the adaptive threshold in the first square wave, determining that there is no glitch waveform in the first square wave.

In step 104, if there is a glitch waveform in the first square wave, the glitch waveform is eliminated from the first square wave so as to obtain a second square wave.

Eliminating the glitch waveform from the first square wave includes: if a level of the glitch waveform is high, reversing the level of the glitch waveform to be low; and if a level of the glitch waveform is low, reversing the level of the glitch waveform to be high.

Figure 2:
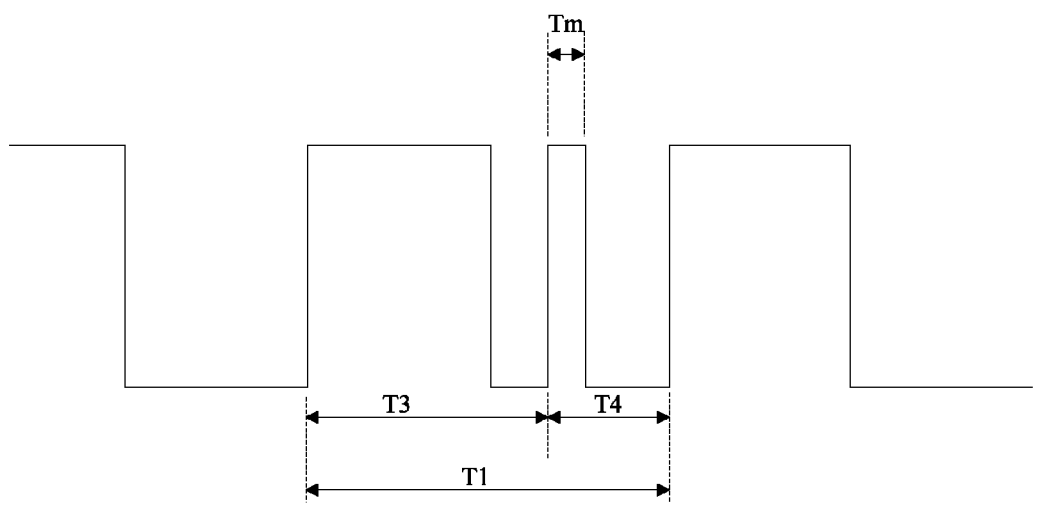
FIG. 2 is a schematic diagram of a square wave with a glitch waveform according to Embodiment 1 of the present disclosure.

In the present disclosure, when the intelligent cipher key token performs a decoding on the square wave, the waveforms are decoded to respective bit values according to the periods of the waveforms. For example, the waveform with period T1 is decoded to bit 1, and the waveform with period T0 is decoded to bit 0. However, the glitch waveform will also occupy a certain width, and if the glitch waveform is not eliminated, the width occupied by the glitch waveform will be calculated in one period when the intelligent cipher key token performs the decoding on the square wave, but the width of the glitch waveform is usually less than that of a normal waveform, therefore, an error or a failure may occur on the data decoding. As shown in FIG. 2, e.g. taking the waveform with one period as example, there is a glitch waveform in the period T1 of one normal waveform, and the width of the glitch waveform is Tm, if the glitch waveform is not eliminated, two waveforms with period T3 and T4 respectively, will be detected during the decoding by the intelligent cipher key token, and then decoding the waveforms with period T3 and T4 will cause an error or a failure of data decoding.

In the present step, after processing the glitch waveform, the width of the original glitch waveform will be merged to a waveform period adjacent to the original glitch waveform, i.e., the glitch waveform is eliminated, and a normal waveform period may be detected when the intelligent cipher key token decodes the square wave obtained after eliminating the glitch waveform, thus avoiding a situation in which the data decoding cannot be performed normally due to the width occupied by the glitch waveform.

In step 105, the second square wave is decoded so as to obtain decoded data.

In the present embodiment, taking the square wave with period T1 representing bit 1 and the square wave with period T0 representing bit 0 as an example, the intelligent cipher key token decodes the square wave with period T1 as bit 1 and decodes the square wave with period T0 as bit 0 when decoding the square waves to obtain decoded data.

Figure 3:
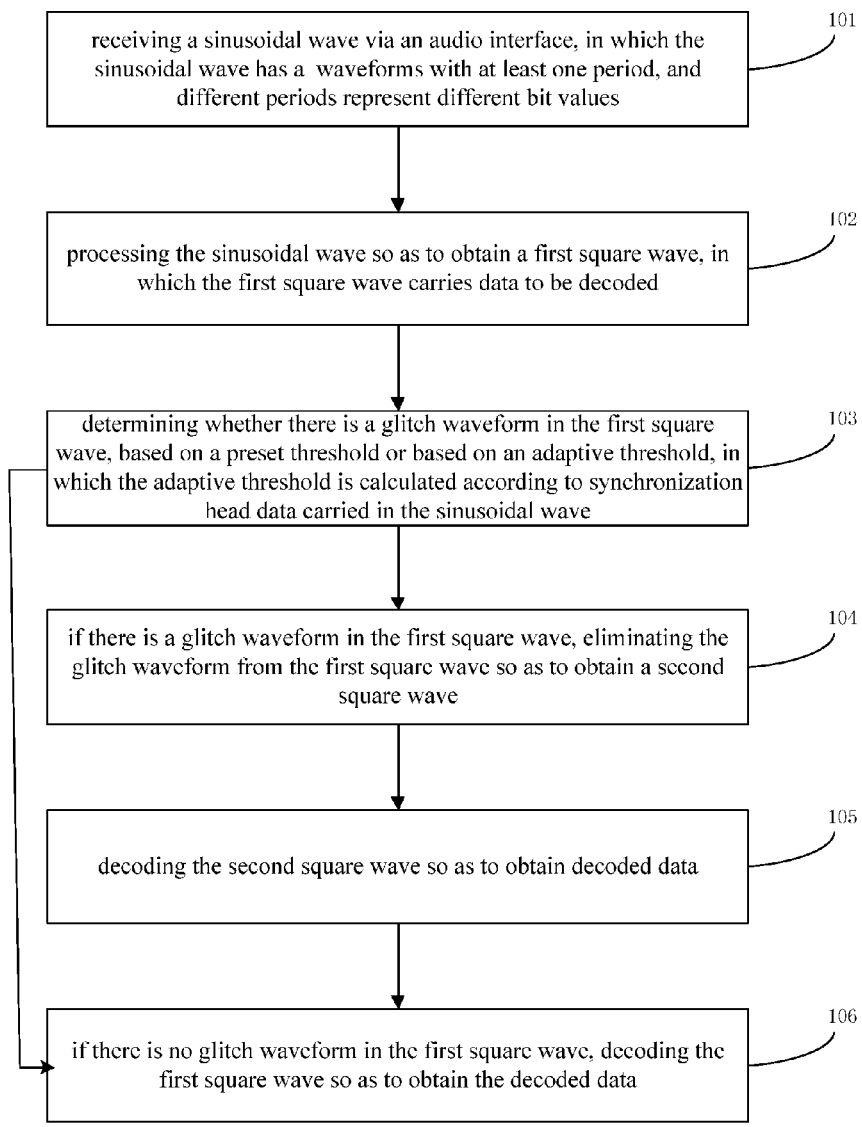
FIG. 3 is a flow chart of another data decoding method according to Embodiment 1 of the present disclosure.

Further, as shown in FIG. 3, the method may further includes step 106, i.e. if there is no glitch waveform in the first square wave, decoding the first square wave so as to obtain decoded data.

According to the above technical solutions of the present disclosure, a data decoding method is provide in the present disclosure, which processes the sinusoidal wave received from the audio interface to a square wave, and detects whether there is a glitch waveform in the square wave, and if there is a glitch waveform in the square wave, considers the glitch waveform as a distortion waveform and eliminates the glitch waveform from the square wave, and then performs the data decoding on the square wave obtained after eliminating the glitch waveform. That is, if there is a glitch waveform in the square wave, the glitch waveform is eliminated so as to eliminate an error caused by a waveform distortion, and the data decoding is performed on the square wave obtained after eliminating the glitch waveform, such that an error rate of the data decoding caused by the waveform distortion is reduced, and the accuracy and success rate of the data decoding in the intelligent cipher key token is improved.

Embodiment 2

Figure 4:
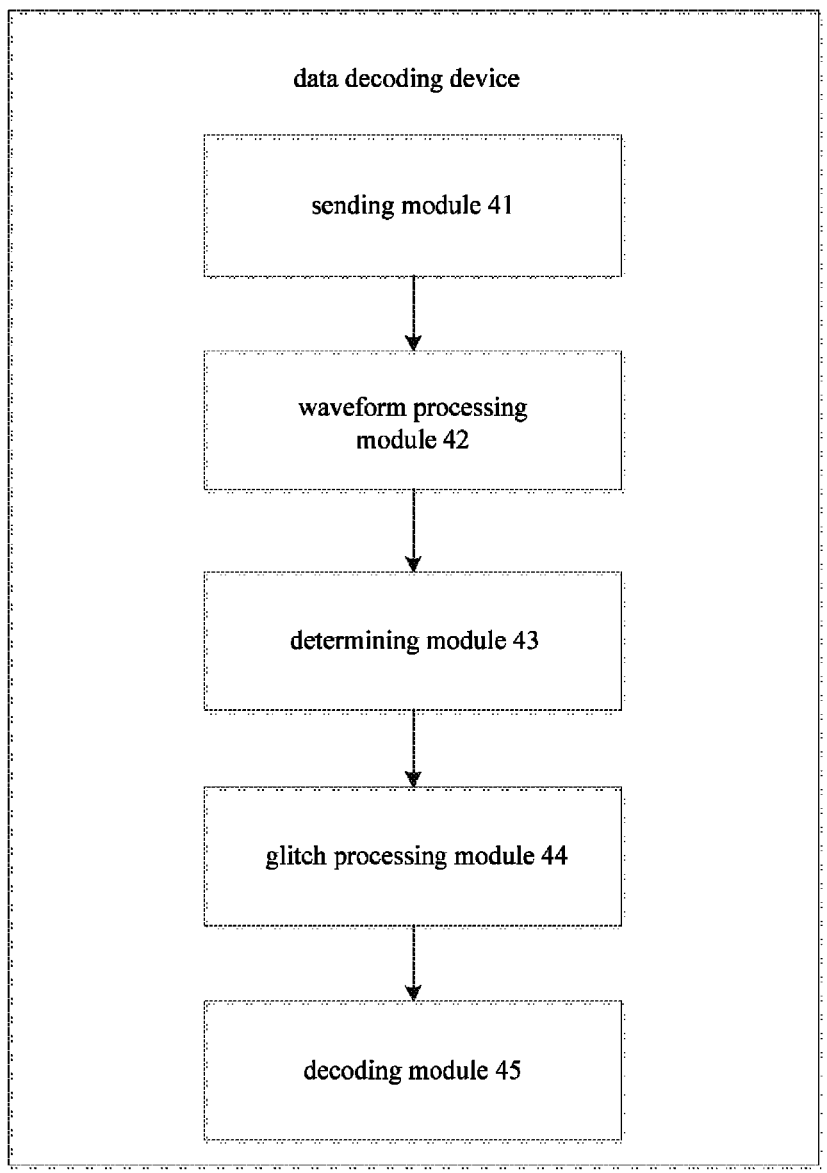
FIG. 4 is a block diagram of a data decoding device according to Embodiment 2 of the present disclosure.

A data decoding device is provided in the present embodiment, and as shown in FIG. 4, the device mainly includes: a sending module 41, a waveform processing module 42, a determining module 43, a glitch processing module 44 and a decoding module 45.

The sending module 41 is configured to receive a sinusoidal wave via an audio interface, in which the sinusoidal wave has a waveform with at least one period, and different periods represent different bit values.

The waveform processing module 42 is configured to process the sinusoidal wave so as to obtain a first square wave, in which the first square wave carries data to be decoded.

The determining module 43 is configured to determine whether there is a glitch waveform in the first square wave, based on a preset threshold or based on an adaptive threshold, in which the adaptive threshold is calculated according to synchronization head data carried in the sinusoidal wave.

The glitch processing module 44 is configured to eliminate a glitch waveform from the first square wave so as to obtain a second square wave, if there is the glitch waveform in the first square wave.

The decoding module 45 is configured to decode the second square wave so as to obtain decoded data.

With the data decoding device provide in the present disclosure, the sinusoidal wave received via the audio interface is processed to a square wave, and it is detected whether there is a glitch waveform in the square wave, and if a glitch waveform is detected, the glitch waveform is regarded as the distortion waveform and eliminated from the square wave, and then the data decoding is performed on the square wave obtained after eliminating the glitch waveform. That is, if there is a glitch waveform in the square wave, the glitch waveform is eliminated so as to eliminate an error caused by a waveform distortion, and the data decoding is performed on the square wave obtained after eliminating the glitch waveform, such that an error rate of the data decoding caused by the waveform distortion is reduced, and the accuracy and success rate of the data decoding in the intelligent cipher key token is improved.

In an embodiment, the decoding module 45 is further configured to decode the first square wave so as to obtain the decoded data if there is no glitch waveform in the first square wave.

In an embodiment, the determining module 43 is configured to determine whether there is a waveform with a width less than the preset threshold in the first square wave, to determine that there is a glitch waveform in the first square wave if there is a waveform with a width less than the preset threshold in the first square wave, and to determine that there is no glitch waveform in the first square wave if there is no waveform with a width less than the preset threshold in the first square wave.

Specifically, the determining module 43 detects a width between a rising edge and an adjacent falling edge in the first square wave or a width between a falling edge and an adjacent rising edge in the first square wave and compares the width detected with the preset threshold. If there is a width less than the preset threshold, the determining module 43 determines that there is a glitch waveform in the first square wave, and if there is no width less than the preset threshold, the determining module 43 determines that there is no glitch waveform in the first square wave.

In an embodiment, the determining module 43 is configured to determine whether there is a waveform with a width less than the adaptive threshold in the first square wave, to determine that there is a glitch waveform in the first square wave if there is a waveform with a width less than the adaptive threshold in the first square wave, and to determine that there is no glitch waveform in the first square wave if there is no waveform with a width less than the adaptive threshold in the first square wave.

Similarly, the determining module 43 detects a width between a rising edge and an adjacent falling edge in the first square wave or a width between a falling edge and an adjacent rising edge in the first square wave, and compares the width detected with the adaptive threshold. If there is a width less than the adaptive threshold, the determining module 43 determines that there is a glitch waveform in the first square wave, and if there is no width less than the preset threshold, the determining module 43 determines that there is no glitch waveform in the first square wave.

The adaptive threshold is calculated by P=i×Q, where, P is the adaptive threshold, Q is a width of a waveform representing the synchronization head data, and i is a preset percentage.

In an embodiment, the glitch processing module 44 is configured to reverse a level of the glitch waveform to be low if the level of the glitch waveform is high, and to reverse a level of the glitch waveform to be high if the level of the glitch waveform is low.

The data decoding device provided in the present embodiment is corresponding to the data decoding method provided in the above Embodiment 1, implementations of respective functional modules in the device are corresponding to those of respective steps in the method provided in the above Embodiment 1, and reference may be made to the related description in the method, which shall not be elaborated herein.

The data decoding device provided in the present disclosure may be an intelligent cipher key token supporting the audio interface, including an audio KEY, a USBKEY, and a Bluetooth KEY, etc.

Embodiment 3

Figure 5:
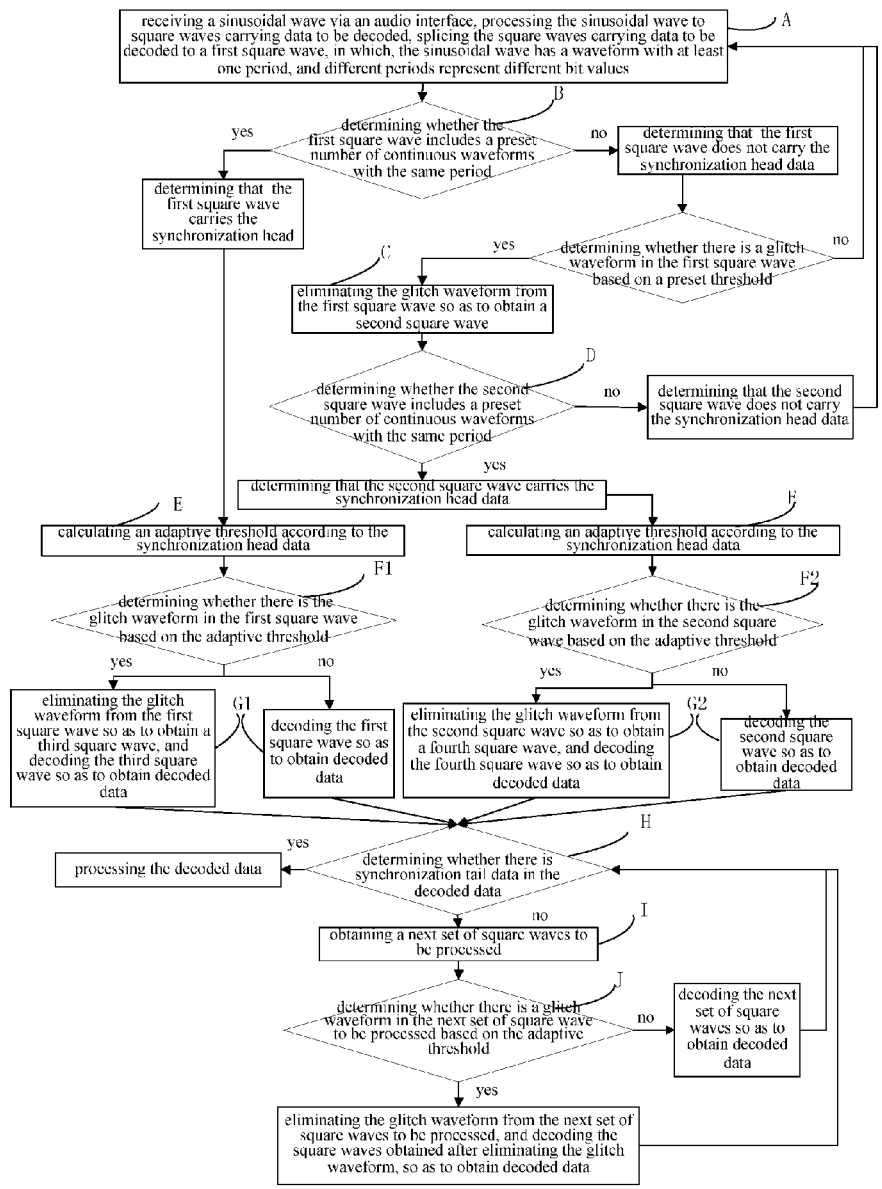
FIG. 5 is a flow chart of yet another data decoding method according to Embodiment 3 of the present disclosure.

A data decoding method is provided in the present embodiment, and as shown in FIG. 5, the method is performed by an intelligent cipher key token supporting an audio interface and mainly includes steps as follows.

In step A, a sinusoidal wave is received via an audio interface, the sinusoidal wave is processed to square waves carrying data to be decoded, and the square waves carrying data to be decoded are spliced to a first square wave, in which, the sinusoidal wave has a waveform with at least one period, and different periods represent different bit values.

The intelligent cipher key token supporting the audio interface receives the sinusoidal wave sent by the external terminal (e.g. a mobile phone, a tablet PC or the like) via the audio interface. The sinusoidal wave is used to transmit data, and different periods in the sinusoidal wave represent different bit values. For example, the sinusoidal wave with period T1 is used to transmit bit 1, and the sinusoidal wave with period T0 is used to transmit bit 0. The intelligent cipher key token processes the sinusoidal wave to the square waves, which carry data to be decoded before the data decoding process, and splices the square waves carrying the data to be decoded to the first square wave, i.e. splices all the square waves without finishing the decoding to the first square wave.

In step B, it is determined whether the first square wave includes a preset number of continuous waveforms with the same period.

When the intelligent cipher key token performs a data interaction with the external terminal, a data structure used may at least include: synchronization head data, data to be transmitted, and synchronization tail data. The synchronization head data may include a preset number of continuous bit values, and is represented as a preset number of continuous waveforms with the same period in the square wave. For example, the synchronization head data may include 8 continuous bits of 1, and the period T1 represents bit 1, and then the synchronization head data may be represented as 8 continuous waveforms with period T1 in the square wave. The synchronization tail data may also include a preset number of continuous bit values, and is represented as a preset number of continuous waveforms with the same period in the square wave. However, the bit value representing the synchronization head data is different from that representing the synchronization tail data, and in the square wave, waveforms with different periods are used. For example, the synchronization tail data includes six continuous bits of 0, and the period T0 represents bit 0, and then the synchronization tail data is represented as six continuous waveforms with period T0 in the square wave.

Thus, before performing the data interaction with the external terminal, the intelligent cipher key token may negotiate with the external terminal through handshake sessions for obtaining a specific format used for transmitting the dat. For example, the intelligent cipher key token may obtain the format used for transmitting the data as follows: the synchronization head data including 8 continuous bits of 1, the data to be transmitted, and the synchronization tail data including 6 continuous bits of 0 in sequence. If the intelligent cipher key token determines that the square wave includes 8 continuous waveforms with the same period T1, it may be determined that the square wave carries the synchronization head data.

After determining in the present step B, if the first square wave includes a preset number of continuous waveforms with the same period, it is determined that the first square wave carries the synchronization head data, and step E is executed; and/or if the first square wave does not include the preset number of continuous waveforms with the same period, it is determined that the first square wave does not carry the synchronization head data, and then it is determined whether there is a glitch waveform in the first square wave based on a preset threshold.

If there is no glitch waveform in the first square wave, step A is executed; and/or if there is glitch waveform in the first square wave, step C is executed.

It should be noted that, the first "and/or" described above may include three alternative implementation methods as follows, which may be chosen according to different requirements in practical use.

In a first implementation method, if the first square wave includes the preset number of continuous waveforms with the same period, it is determined that the first square wave carries the synchronization head data, and step E is executed. Moreover, if the first square wave does not include the preset number of continuous waveforms with the same period, it is determined that the first square wave does not carry the synchronization head data, and then it is determined whether there is a glitch waveform in the first square wave based on a preset threshold. In this case, executing which branch is determined according to the determining result in step B.

In a second implementation method, if the first square wave includes the preset number of continuous waveforms with the same period, it is determined that the first square wave carries the synchronization head data, and step E is executed. That is, in the second implementation method, only the subsequent operations related to the determining result that there are preset number of continuous waveforms with the same period are executed. But for the determining result that there are no preset number of continuous waveforms with the same period, the related subsequent operations may not be executed, or may be paused, which shall not be limited herein.

In a third implementation method, if the first square wave does not include the preset number of continuous waveforms with the same period, it is determined that the first square wave does not carry the synchronization head data, and then it is determined whether there is a glitch waveform in the first square wave based on a preset threshold. That is, in the third implementation method, only the subsequent operations related to the determining result that there are no preset number of continuous waveforms with the same period are executed. But for the determining result that there are the preset number of continuous waveforms with the same period, the related subsequent operations may not be executed, or may be paused, which shall not be limited herein.

Similarly, the second "and/or" described above may include three alternative implementation methods as follows, which may be chosen according to different requirements in practical use.

In a first implementation method, if there is no glitch waveform in the first square wave, step A is executed; and if there is a glitch waveform in the first square wave, step C is executed. In this case, executing which subsequent operations will be determined according to the determining result of determining whether there is a glitch waveform in the first square wave based on the preset threshold.

In a second implementation method, if there is no glitch waveform in the first square wave, step A is executed. That is, in the second implementation method, only the subsequent operations related to the determining result that there is no glitch waveform in the first square wave are executed. But for the determining result that there is a glitch waveform in the first square wave, the subsequent operations may not be executed, or may be paused, which shall not be limited herein.

In a third implementation method, if there is a glitch waveform in the first square wave, step C is executed. That is, in the third implementation method, only the subsequent operations related to the determining result that there is a glitch waveform in the first square wave are executed. But for the determining result that there is no glitch waveform in the first square wave, the subsequent operations may not be executed, or may be paused, which shall not be limited herein.

In the present embodiment, if it is determined that the first square wave does not carry the synchronization head data, it is required to perform a glitch waveform detection on the first square wave, so as to avoid a misjudgment caused by the glitch waveform in the first square wave. If a glitch waveform is detected, the glitch waveform is eliminated, and looking for the synchronization head data (i.e., steps C-D) is performed on the square wave obtained after eliminating the glitch waveform. If there is no glitch waveform detected, it indicates that there is no synchronization head data found, and then a next group of square waves needs to be received and spliced with the previous square waves for looking for the synchronization head data (i.e., returning to step A).

In the present embodiment, determining whether there is a glitch waveform in the first square wave based on a preset threshold includes: determining whether there is a waveform with a width less than the preset threshold in the first square wave, determining that there is a glitch waveform in the first square wave if there is a waveform with a width less than the preset threshold in the first square wave, and determining that there is no glitch waveform in the first square wave if there is no waveform with a width less than the preset threshold in the first square wave. Specifically, a width between a rising edge and an adjacent falling edge in the first square wave or a width between a falling edge and an adjacent rising edge in the first square wave is detected and the width detected is compared with the preset threshold. If there is a width less than the preset threshold, it is determined that there is a glitch waveform in the first square wave, and if there is no width less than the preset threshold, it is determined that there is no glitch waveform in the first square wave.

The preset threshold may be specifically set according to various requirements for the actual applications.

In the present embodiment, when the intelligent cipher key token performs a decoding on the square wave, the waveforms are decoded to respective bit values according to the periods of the waveforms. For example, the waveform with period T1 is decoded to bit 1, and the waveform with period T0 is decoded to bit 0. However, the glitch waveform will also occupy a certain width, if the glitch waveform is not eliminated, the width occupied by the glitch waveform will be calculated in one period when the intelligent cipher key token performs the decoding on the square wave, but the width of the glitch waveform is usually less than that of a normal waveform, therefore, an error or a failure may occur on the data decoding. As shown in FIG. 2, e.g. taking the waveform with one period as example, there is a glitch waveform in the period T1 of one normal waveform, and the width of the glitch waveform is Tm, if the glitch waveform is not eliminated, two waveforms with period T3 and T4 respectively, will be detected during the decoding by the intelligent cipher key token, and then decoding the waveforms with period T3 and T4 will cause an error or a failure of data decoding.

In step C, the glitch waveform is eliminated from the first square wave so as to obtain a second square wave.

An implementation method of eliminating the glitch waveform includes: if a level of the glitch waveform is high, reversing the level of the glitch waveform to be low; and if a level of the glitch waveform is low, reversing the level of the glitch waveform to be high.

In the present embodiment, after processing the glitch waveform, the width of the original glitch waveform will be merged to a waveform period adjacent to the original glitch waveform, i.e., the glitch waveform is eliminated, and a normal waveform period may be detected when the intelligent cipher key token decodes the square wave obtained after eliminating the glitch waveform, thus avoiding a situation in which the data decoding cannot be performed normally due to the width occupied by the glitch waveform.

In step D, it is determined whether the second square wave includes a preset number of continuous waveforms with the same period.

If the second square wave includes the preset number of continuous waveforms with the same period, it is determined that the second square wave carries the synchronization head data, and step E is executed; and/or if the second square wave does not include the preset number of continuous waveforms with the same period, it is determined that the second square wave does not carry the synchronization head data, and step A is executed.

It should be noted that, the above described "and/or" may include three alternative implementation methods as follows, which may be chosen according to different requirements in practical use.

In a first implementation method, if the second square wave includes the preset number of continuous waveforms with the same period, it is determined that the second square wave carries the synchronization head data, and step E is executed. Moreover, if the second square wave does not include the preset number of continuous waveforms with the same period, it is determined that the second square wave does not carry the synchronization head data, and step A is executed. In this case, executing which branch is determined according to the determining result of the present step.

In a second implementation method, if the second square wave includes the preset number of continuous waveforms with the same period, it is determined that the second square wave carries the synchronization head data, and step E is executed. That is, in the second implementation method, only the subsequent operations related to the determining result that there are preset number of continuous waveforms with the same period are executed. But for the determining result that there are no preset number of continuous waveforms with the same period, the subsequent operations may not be executed, or may be paused, which shall not be limited herein.

In a third implementation method, if the second square wave does not include the preset number of continuous waveforms with the same period, it is determined that the second square wave does not carry the synchronization head data, and step A is executed. That is, in the third implementation method, only the subsequent operations related to the determining result that there are no preset number of continuous waveforms with the same period are executed. But for the determining result that there are preset number of continuous waveforms with the same period, the subsequent operations may not be executed, or may be paused, which shall not be limited herein.

In the present embodiment, if second square wave includes the preset number of continuous waveforms with the same period, it is determined that the second square wave carries the synchronization head data, and step E is executed. In this case, it indicates that there is the synchronization head data carried in the first square wave, but since there is the glitch waveform in the first square wave, the synchronization head data may not be detected accurately. After eliminating the glitch waveform from the first square wave and obtaining the second square wave, the synchronization head data may be detected successfully in the second square wave. Therefore, the accuracy and success rate of the waveform detection for the intelligent cipher key token may be improved through detecting and eliminating the glitch waveform.

If the second square wave does not include the preset number of continuous waveforms with the same period, it is determined that there is no synchronization head data carried in the second square wave, and step A is executed. In this case, it indicates that there is no synchronization head data carried in the first square wave and the situation in which the synchronization head data cannot be detected due to the glitch waveform in the first wave is excluded.

In step E, an adaptive threshold is calculated according to the synchronization head data.

If the previous step is step B, step F1 is executed. In this case, there is the synchronization head data detected in the first square wave, and therefore, the adaptive threshold may be calculated directly according to the synchronization head data, and step F1 is executed for determining whether there is glitch waveform in the first square wave based on the adaptive threshold.

If the previous step is step D, step F1 or F2 is executed. In this case, there is no synchronization head data detected in the first square wave, after eliminating the glitch waveform from the first square wave through steps C-D, the second square wave is obtained, and the synchronization head data is detected in the second square wave. Therefore, after calculating the adaptive threshold according to the synchronization head data, step F1 may be executed to determine whether there is the glitch waveform in the first square wave based on the adaptive threshold (not shown in FIG. 5, and may be optionally executed according to actual application requirements), or step F2 may also be executed to further determine whether there is the glitch waveform in the second square wave based on the adaptive threshold (shown in FIG. 5).

In the present embodiment, the adaptive threshold is calculated by $P=i\times Q$, where, P is the adaptive threshold, Q is a width of a waveform representing the synchronization head data, and i is a preset percentage. For example, the value of i may be specifically set according to various requirements for actual applications, e.g. may be 5%. Taking the width of the waveform representing the synchronization head data being 30 as an example, the adaptive threshold is 30*5%=1.5.

In the present embodiment, the adaptive threshold is used to determine whether there is a glitch waveform, which will further improve the accuracy of the glitch waveform detection.

In step F1, it is determined whether there is the glitch waveform in the first square wave based on the adaptive threshold, and step G1 is executed.

In step F2, it is determined whether there is the glitch waveform in the second square wave based on the adaptive threshold, and step G2 is executed.

When determining whether there is a glitch waveform based on an adaptive threshold, whether there is a waveform with a width less than the adaptive threshold may be determined, if there is a waveform with a width less than the adaptive threshold, it is determined that there is a glitch waveform; and if there is no waveform with a width less than the adaptive threshold, it is determined that there is no glitch waveform. Specifically, in step F1, a width between a rising edge and an adjacent falling edge in the first square wave or a width between a falling edge and an adjacent rising edge in the first square wave is detected, and the width detected is compared with the adaptive threshold. If there is a width less than the adaptive threshold, it is determined that there is a glitch waveform in the first square wave, and if there is no width less than the adaptive threshold, it is determined that there is no glitch waveform in the first square wave. In step F2, a width between a rising edge and an adjacent falling edge in the second square wave or a width between a falling edge and an adjacent rising edge in the second square wave is detected, and the width detected is compared with the adaptive threshold. If there is a width less than the adaptive threshold, it is determined that there is a glitch waveform in the second square wave, and if there is no width less than the adaptive threshold, it is determined that there is no glitch waveform in the second square wave.

In step G1, if there is the glitch waveform in the first square wave, the glitch waveform is eliminated from the first square wave so as to obtain a third square wave, and the third square wave is decoded so as to obtain decoded data; and/or if there is no glitch waveform in the first square wave, the first square wave is decoded so as to obtain decoded data.

It should be noted that, the above described "and/or" in step G1 may include three alternative implementation methods as follows, which may be chosen according to different requirements in practical use.

In a first implementation method, if there is the glitch waveform in the first square wave, the glitch waveform is eliminated from the first square wave so as to obtain a third square wave, and the third square wave is decoded so as to obtain decoded data; and, if there is no glitch waveform in the first square wave, the first square wave is decoded so as to obtain decoded data. In this case, according to the determining result of step F1 (determining whether there is the glitch waveform in the first square wave based on the adaptive threshold), executing which branch is determined.

In a second implementation method, if there is the glitch waveform in the first square wave, the glitch waveform is eliminated from the first square wave so as to obtain a third square wave, and the third square wave is decoded so as to obtain decoded data. That is, in the second implementation method, only the subsequent operations related to the determining result that there is the glitch waveform are executed. But for the determining result that there is no glitch waveform, the subsequent operations may not be executed, or may be paused, which shall not be limited herein.

In a third implementation method, if there is no glitch waveform in the first square wave, the first square wave is decoded so as to obtain decoded data. That is, in the third implementation method, only the subsequent operations related to the determining result that there is no glitch waveform are executed. But for the determining result there is glitch waveform, the subsequent operations may not be executed, or may be paused, which shall not be limited herein.

In step G2, if there is the glitch waveform in the second square wave, the glitch waveform is eliminated from the second square wave so as to obtain a fourth square wave, and the fourth square wave is decoded so as to obtain decoded data; and/or if there is no glitch waveform in the second square wave, the second square wave is decoded so as to obtain decoded data.

In the present embodiment, taking the square wave with period T1 representing bit 1 and the square wave with period T0 representing bit 0 as an example, the intelligent cipher key token decodes the square wave with period T1 as bit 1 and decodes the square wave with period T0 as bit 0 when decoding the square waves to obtain the decoded data.

It should be noted that, the above described "and/or" in step G2 may include three alternative implementation methods as follows, which may be chosen according to different requirements in practical use.

In a first implementation method, if there is the glitch waveform in the second square wave, the glitch waveform is eliminated from the second square wave so as to obtain a fourth square wave, and the fourth square wave is decoded so as to obtain decoded data; and, if there is no glitch waveform in the second square wave, the second square wave is decoded so as to obtain decoded data. In this case, according to the determining result of step F2 (determining whether there is the glitch waveform in the second square wave based on the adaptive threshold), executing which branch is determined.

In a second implementation method, if there is the glitch waveform in the second square wave, the glitch waveform is eliminated from the second square wave so as to obtain a fourth square wave, and the fourth square wave is decoded so as to obtain decoded data. That is, in the second implementation method, only the subsequent operations related to the determining result that there is the glitch waveform are executed. But for the determining result that there is no glitch waveform, the subsequent operations may not be executed, or may be paused, which shall not be limited herein.

In a third implementation method, if there is no glitch waveform in the second square wave, the second square wave is decoded so as to obtain decoded data. That is, in the third implementation method, only the subsequent operations related to the determining result that there is no glitch waveform are executed. But for the determining result that there is glitch waveform, the subsequent operations may not be executed, or may be paused, which shall not be limited herein.

In the embodiment of the present disclosure, before the intelligent cipher key token performs the data decoding, a glitch waveform detection is executed for the square wave (e.g. the first square wave or the second square wave) based on the adaptive threshold, and when it is detected that there is a glitch waveform in the square wave, the glitch waveform is eliminated from the square wave, and the square wave obtained after eliminating the glitch waveform is decoded, such that an error rate of the data decoding caused by the glitch waveform is reduced, and the accuracy and success rate of the data decoding is improved.

Further, as shown in FIG. 5, the above described method may further include steps H-J after the data decoding is completed.

In step H, it is determined whether there is synchronization tail data in the decoded data.

If there is synchronization tail data in the decoded data, the decoded data is processed. The decoded data may be processed according to actual application requirements, for example, a verifying, a display and a signature for transaction data may be performed according to the decoded data.

If there is no synchronization tail data in the decoded data, step I is executed.

In step I, a next set of square waves to be processed is obtained.

In step J, it is determined whether there is a glitch waveform in the next set of square waves to be processed based on the adaptive threshold.

If there is a glitch waveform in the next set of square waves to be processed, the glitch waveform is eliminated from the next set of square waves to be processed, and the square waves obtained after eliminating the glitch waveform are decoded so as to obtain decoded data, and then step H is executed.

If there is no glitch waveform in the next set of square waves to be processed, the next set of square waves is decoded so as to obtain decoded data, and step H is executed.

According to the present embodiment, the sinusoidal wave received via the audio interface is processed to the square wave, and it is determined whether there is a glitch waveform in the square wave based on the preset threshold or the adaptive threshold, if there is a glitch waveform in the square wave, the glitch waveform is regarded as the distortion waveform and eliminated from the square wave s, and then the square wave obtained after eliminating the glitch waveform is decoded so as to obtain decoded data. That is, if there is a glitch waveform in the square wave, the glitch waveform is eliminated so as to eliminate an error caused by a waveform distortion, and the square wave obtained after eliminating the glitch waveform is decoded, such that an error rate of the data decoding caused by the waveform distortion is reduced, and the accuracy and success rate of the data decoding in the intelligent cipher key token is improved.

It should be noted that, in an implementation of the data decoding method provided by Embodiment 3, data decoding is first performed on the square wave, and then it is determined whether the synchronization tail data is found. Of course, there is also another implementation of the data decoding method, in which it is first determined whether there is the synchronization tail data in the square wave, and then the data decoding is performed after the synchronization tail data is found, which will be described in Embodiment 4.

Embodiment 4

Figure 6:
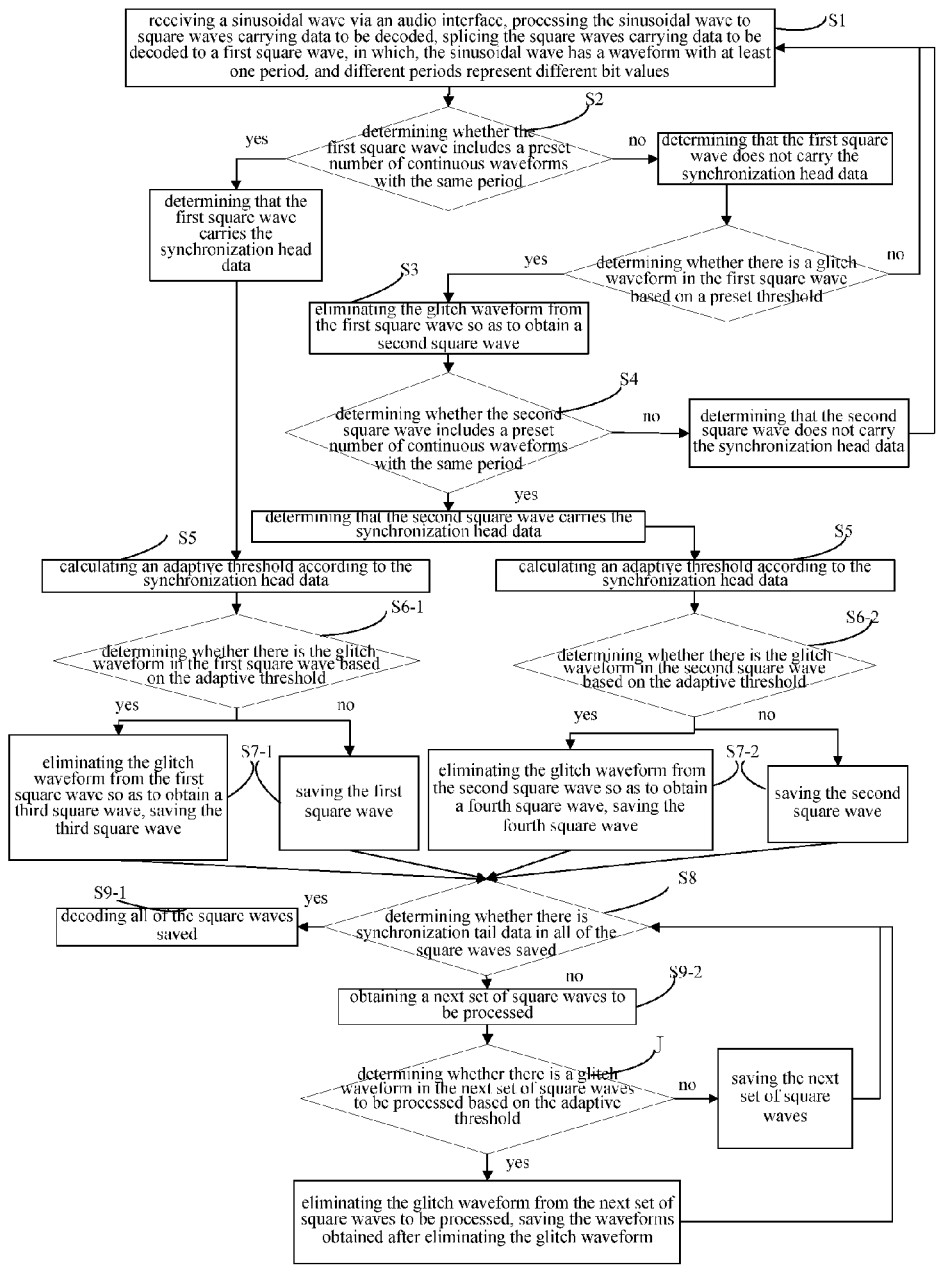
FIG. 6 is a flow chart of yet still another data decoding method according to Embodiment 4 of the present disclosure.

A data decoding method is provided in the present embodiment, and as shown in FIG. 6, the method may be executed by an intelligent cipher key token supporting an audio interface, and includes steps S1-S9-2 as follows.

In step S1, a sinusoidal wave is received via an audio interface, the sinusoidal wave is processed to obtain square waves carrying data to be decoded, and the square waves carrying data to be decoded are spliced to a first square wave, in which, the sinusoidal wave has a waveform with at least one period, and different periods represent different bit values.

In step S2, it is determined whether the first square wave includes a preset number of continuous waveforms with the same period.

If the first square wave includes the preset number of continuous waveforms with the same period, it is determined that the first square wave carries synchronization head data, and step S5 is executed; and/or if the first square wave does not include the preset number of continuous waveforms with the same period, it is determined that the first square wave does not carry the synchronization head data, and then it is determined whether there is a glitch waveform in the first square wave based on a preset threshold.

Determining whether there is a glitch waveform based on a preset threshold includes: determining whether there is a waveform with a width less than the preset threshold; if there is a waveform with a width less than the preset threshold, determining that there is a glitch waveform; and if there is no waveform with a width less than the preset threshold, determining that there is no glitch waveform. Specifically, a width between a rising edge and an adjacent falling edge in the first square wave or a width between a falling edge and an adjacent rising edge in the first square wave is detected and the width detected is compared with the preset threshold. If there is a width less than the preset threshold, it is determined that there is a glitch waveform in the first square wave, and if there is no width less than the preset threshold, it is determined that there is no glitch waveform in the first square wave.

If there is no glitch waveform in the first square wave, step S1 is executed; and/or if there is a glitch waveform in the first square wave, step S3 is executed.

It should be noted that, the first "and/or" described above may include three alternative implementation methods as follows, which may be chosen according to different requirements in practical use.

In a first implementation method, if the first square wave includes the preset number of continuous waveforms with the same period, it is determined that the first square wave carries synchronization head data, and step S5 is executed; and, if the first square wave does not include the preset number of continuous waveforms with the same period, it is determined that the first square wave does not carry the synchronization head data, and then it is determined whether there is a glitch waveform in the first square wave based on a preset threshold. In this case, executing which branch is determined according to the determining result of the present step S2.

In a second implementation method, if the first square wave includes the preset number of continuous waveforms with the same period, it is determined that the first square wave carries synchronization head data, and step S5 is executed. That is, in the second implementation method, only the subsequent operations related to the determining result that the first square wave includes the preset number of continuous waveforms with the same period are executed. But for the determining result that the first square wave does not include the preset number of continuous waveforms with the same period, the subsequent operations may not be executed, or may be paused, which shall not be limited herein.

In a third implementation method, if the first square wave does not include the preset number of continuous waveforms with the same period, it is determined that the first square wave does not carry the synchronization head data, and then it is determined whether there is a glitch waveform in the first square wave based on a preset threshold. That is, in the third implementation method, only the subsequent operations related to the determining result that the first square wave does not include the preset number of continuous waveforms with the same period are executed. But for the determining result that the first square wave includes the preset number of continuous waveforms with the same period, the subsequent operations may not be executed, or may be paused, which shall not be limited herein.

Similarly, the second "and/or" described above may include three alternative implementation methods as follows, which may be chosen according to different requirements in practical use.

In a first implementation method, if there is no glitch waveform in the first square wave, step S1 is executed; and if there is the glitch waveform in the first square wave, step S3 is executed. In this case, executing subsequent operations in which branch is determined according to the determining result of determining whether there is the glitch waveform in the first square wave based on the preset threshold.

In a second implementation method, if there is no glitch waveform in the first square wave, step S1 is executed. That is, in the second implementation method, only the subsequent operations related to the determining result that there is no glitch waveform in the first square wave are executed. But for the determining result that there is a glitch waveform in the first square wave, the subsequent operations may not be executed, or may be paused, which shall not be limited herein.

In a third implementation method, if there is a glitch waveform in the first square wave, step S3 is executed. That is, in the third implementation method, only the subsequent operations related to the determining result that there is a glitch waveform in the first square wave are executed. But for the determining result that there is no glitch waveform in the first square wave, the subsequent operations may not be executed, or may be paused, which shall not be limited herein.

In step S3, the glitch waveform is eliminated from the first square wave so as to obtain a second square wave.

An implementation method of eliminating the glitch waveform from the first square wave may include: if a level of the glitch waveform is high, reversing the level of the glitch waveform to be low; and if a level of the glitch waveform is low, reversing the level of the glitch waveform to be high.

In step S4, it is determined whether the second square wave includes a preset number of continuous waveforms with the same period.

If the second square wave includes the preset number of continuous waveforms with the same period, it is determined that the second square wave carries synchronization head data, and step S5 is executed; and/or if the second square wave does not include the preset number of continuous waveforms with the same period, it is determined that the second square wave does not carry the synchronization head data, and step S1 is executed.

It should be noted that, the above described "and/or" may include three alternative implementation methods as follows, which may be chosen according to different requirements in practical use.

In a first implementation method, if the second square wave includes the preset number of continuous waveforms with the same period, it is determined that the second square wave carries the synchronization head data, and step S5 is executed; and, if the second square wave does not include the preset number of continuous waveforms with the same period, it is determined that the second square wave does not carry the synchronization head data, and step S1 is executed. In this case, executing which branch is determined according to the determining result of the present step.

In a second implementation method, if the second square wave includes the preset number of continuous waveforms with the same period, it is determined that the second square wave carries the synchronization head data, and step S5 is executed. That is, in the second implementation method, only the subsequent operations related to the determining result that the second square wave includes the preset number of continuous waveforms with the same period are executed. But for the determining result that the second square wave does not include the preset number of continuous waveforms with the same period, the subsequent operations may not be executed, or may be paused, which shall not be limited herein.

In a third implementation method, if the second square wave does not include the preset number of continuous waveforms with the same period, it is determined that the second square wave does not carry the synchronization head data, and step S1 is executed. That is, in the third implementation method, only the subsequent operations related to the determining result that the second square wave does not include the preset number of continuous waveforms with the same period are executed. But for the determining result that the second square wave includes the preset number of continuous waveforms with the same period, the subsequent operations may not be executed, or may be paused, which shall not be limited herein.

In step S5, an adaptive threshold is calculated according to the synchronization head data.

Calculating the adaptive threshold according to the synchronization head data includes: calculating the adaptive threshold by $P=i\times Q$, where, P is the adaptive threshold, Q is a width of a waveform representing the synchronization head data, and i is a preset percentage.

If the previous step is step S2, step S6-1 is executed, and if the previous step is step S4, step S6-1 or S6-2 is executed.

In step S6-1, it is determined whether there is the glitch waveform in the first square wave based on the adaptive threshold, and step S7-1 is executed.

In step S6-2, it is determined whether there is the glitch waveform in the second square wave based on the adaptive threshold, and step S7-2 is executed.

When determining whether there is a glitch waveform based on an adaptive threshold, whether there is a waveform with a width less than the adaptive threshold may be determined. If there is a waveform with a width less than the adaptive threshold, it is determined that there is a glitch waveform; and if there is no waveform with a width less than the adaptive threshold, it is determined that there is no glitch waveform. Specifically, in step S6-1, a width between a rising edge and an adjacent falling edge in the first square wave or a width between a falling edge and an adjacent rising edge in the first square wave is detected, and the width detected is compared with the adaptive threshold. If there is a width less than the adaptive threshold, it is determined that there is a glitch waveform in the first square wave, and if there is no width less than the adaptive threshold, it is determined that there is no glitch waveform in the first square wave. In step S6-2, a width between a rising edge and an adjacent falling edge in the second square wave or a width between a falling edge and an adjacent rising edge in the second square wave is detected, and the width detected is compared with the adaptive threshold. If there is a width less than the adaptive threshold, it is determined that there is a glitch waveform in the second square wave, and if there is no width less than the adaptive threshold, it is determined that there is no glitch waveform in the second square wave.

In step S7-1, if there is the glitch waveform in the first square wave, the glitch waveform is eliminated from the first square wave so as to obtain a third square wave, the third square wave is saved, and step S8 is executed; and/or if there is no glitch waveform in the first square wave, the first square wave is saved, and step S8 is executed.

It should be noted that, the above described "and/or" in step 7-1 may include three alternative implementation methods as follows, which may be chosen according to different requirements in practical use.

In a first implementation method, if there is the glitch waveform in the first square wave, the glitch waveform is eliminated from the first square wave so as to obtain a third square wave, the third square wave is saved, and step S8 is executed; and, if there is no glitch waveform in the first square wave, the first square wave is saved, and step S8 is executed. In this case, executing which branch is determined according to the determining result of determining whether there is the glitch waveform in the first square wave based on the adaptive threshold.

In a second implementation method, if there is the glitch waveform in the first square wave, the glitch waveform is eliminated from the first square wave so as to obtain a third square wave, the third square wave is saved, and step S8 is executed. But for the determining result that there is no glitch waveform, the related subsequent operations may not be executed, or may be paused, which shall not be limited herein.

In a third implementation method, if there is no glitch waveform in the first square wave, the first square wave is saved, and step S8 is executed. But for the determining result that there is glitch waveform, the related subsequent operations may not be executed, or may be paused, which shall not be limited herein.

In step S7-2, if there is the glitch waveform in the second square wave, the glitch waveform is eliminated from the second square wave so as to obtain a fourth square wave, the fourth square wave is saved, and step S8 is executed; and/or if there is no glitch waveform in the second square wave, the second square wave is saved, and step S8 is executed.

It should be noted that, the above described "and/or" in step S7-2 may include three alternative implementation methods as follows, which may be chosen according to different requirements in practical use.

In a first implementation method, if there is the glitch waveform in the second square wave, the glitch waveform is eliminated from the second square wave so as to obtain a fourth square wave, the fourth square wave is saved, and step S8 is executed; and, if there is no glitch waveform in the second square wave, the second square wave is saved, and step S8 is executed. In this case, executing which branch is determined according to the determining result of determining whether there is the glitch waveform in the second square wave based on the adaptive threshold.

In a second implementation method, if there is the glitch waveform in the second square wave, the glitch waveform is eliminated from the second square wave so as to obtain a fourth square wave, the fourth square wave is saved, and step S8 is executed. But for the determining result that there is no glitch waveform, the related subsequent operations may not be executed, or may be paused, which shall not be limited herein.

In a third implementation method, if there is no glitch waveform in the second square wave, the second square wave is saved, and step S8 is executed. But for the determining result that there is the glitch waveform, the related subsequent operations may not be executed, or may be paused, which shall not be limited herein.

In step S8, it is determined whether there is synchronization tail data in all of the square waves saved.

In step S9-1, if there is synchronization tail data in all of the square waves saved, all of the square waves saved are decoded.

The method further includes S9-2 after step S8. In step S9-2, if there is no synchronization tail data in all of the square waves saved, a next set of square waves to be processed is obtained, and it is determined whether there is a glitch waveform in the next set of square waves to be processed based on the adaptive threshold.

If there is a glitch waveform in the next set of square waves to be processed, the glitch waveform is eliminated from the next set of square waves to be processed, the waveform obtained after eliminating the glitch waveform is saved, and step S8 is executed.

If there is no glitch waveform in the next set of square waves to be processed, the next set of square waves is saved, and step S8 is executed.

According to the present embodiment, the sinusoidal wave received via the audio interface is processed to the square wave, and it is determined whether there is a glitch waveform in the square wave based on the preset threshold or the adaptive threshold, if there is a glitch waveform in the square wave, the glitch waveform is regarded as the distortion waveform and eliminated from the square wave, and then data decoding is performed on the square wave obtained after eliminating the glitch waveform. That is, if there is a glitch waveform in the square wave, the glitch waveform is eliminated so as to eliminate an error caused by a waveform distortion, and the square wave obtained after eliminating the glitch waveform is decoded, such that an error rate of the data decoding caused by the waveform distortion is reduced, and the accuracy and success rate of the data decoding in the intelligent cipher key token is improved.

The difference between Embodiment 3 and Embodiment 4 is in that, in an implementation of the data decoding method provided by Embodiment 3, the data decoding is performed first, and then the synchronization tail data is detected; however, in the implementation of the data decoding method provided by Embodiment 4, the synchronization tail data is detected first, and then the data decoding is performed.

It should be noted that, the specific implementations of Embodiment 3 and 4 are the same in steps of detecting the synchronization head data, calculating the adaptive threshold according to the synchronization head data, determining whether there is a glitch waveform based on the preset threshold or the adaptive threshold, eliminating the glitch waveform and detecting the synchronization tail data etc., which are not limited by Embodiment 4, and may refer to an limited explanation corresponding to respective steps of Embodiment 3, which shall not be elaborated herein.

Embodiments 3 and 4 may be applied to the intelligent cipher key token supporting an audio interface, which may include an audio KEY, a USBKEY, an electronic signature token, an intelligent cipher key token integrated USBKEY with an electronic token, etc.

In addition, the intelligent cipher key token supporting an audio interface in the present embodiment may also support a USB interface, a Bluetooth interface, an infrared interface, a wifi interface and other communication interfaces.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, which should be understood by those skilled in the art.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks, CD, etc.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A data decoding method, comprising:
receiving a sinusoidal wave via an audio interface, wherein the sinusoidal wave has a waveform with at least one period, and different periods represent different bit values;
processing the sinusoidal wave so as to obtain a first square wave, wherein the first square wave carries data to be decoded;
determining whether there is a glitch waveform in the first square wave, based on a preset threshold or based on an adaptive threshold, wherein the adaptive threshold is calculated according to synchronization head data carried in the sinusoidal wave;
if there is a glitch waveform in the first square wave, eliminating the glitch waveform from the first square wave so as to obtain a second square wave; and
decoding the second square wave so as to obtain decoded data.

2. The method according to claim 1, further comprising:
if there is no glitch waveform in the first square wave, decoding the first square wave so as to obtain the decoded data.

3. The method according to claim 1, wherein, the adaptive threshold is calculated by P=i×Q, where, P is the adaptive threshold, Q is a width of a waveform representing the synchronization head data, and i is a preset percentage.

4. The method according to claim 1, wherein, determining whether there is a glitch waveform in the first square wave based on a preset threshold comprises:
determining whether there is a waveform with a width less than the preset threshold in the first square wave,
if there is a waveform with a width less than the preset threshold in the first square wave, determining that there is a glitch waveform in the first square wave; and
if there is no waveform with a width less than the preset threshold in the first square wave, determining that there is no glitch waveform in the first square wave.

5. The method according to claim 1, wherein, determining whether there is a glitch waveform in the first square wave based on an adaptive threshold comprises:
determining whether there is a waveform with a width less than the adaptive threshold in the first square wave,
if there is a waveform with a width less than the adaptive threshold in the first square wave, determining that there is a glitch waveform in the first square wave; and
if there is no waveform with a width less than the adaptive threshold in the first square wave, determining that there is no glitch waveform in the first square wave.

6. The method according to claim 1, wherein, eliminating the glitch waveform from the first square wave comprises:
if a level of the glitch waveform is high, reversing the level of the glitch waveform to be low; and
if a level of the glitch waveform is low, reversing the level of the glitch waveform to be high.

7. A data decoding device, comprising:
a sending module, configured to receive a sinusoidal wave via an audio interface, wherein the sinusoidal wave has a waveform with at least one period, and different periods represent different bit values;
a waveform processing module, configured to process the sinusoidal wave so as to obtain a first square wave, wherein the first square wave carries data to be decoded;
a determining module, configured to determine whether there is a glitch waveform in the first square wave, based on a preset threshold or based on an adaptive threshold, wherein the adaptive threshold is calculated according to synchronization head data carried in the sinusoidal wave;
a glitch processing module, configured to eliminate a glitch waveform from the first square wave so as to obtain a second square wave, if there is the glitch waveform in the first square wave; and
a decoding module, configured to decode the second square wave so as to obtain decoded data.

8. The device according to claim 7, wherein
the determining module is configured to determine whether there is a waveform with a width less than the preset threshold in the first square wave, to determine that there is a glitch waveform in the first square wave if there is a waveform with a width less than the preset threshold in the first square wave, and to determine that there is no glitch waveform in the first square wave if there is no waveform with a width less than the preset threshold in the first square wave.

9. The device according to claim 7, wherein
the determining module is configured to determine whether there is a waveform with a width less than the adaptive threshold in the first square wave, to determine that there is a glitch waveform in the first square wave if there is a waveform with a width less than the adaptive threshold in the first square wave, and to determine that there is no glitch waveform in the first square wave if there is no waveform with a width less than the adaptive threshold in the first square wave;
wherein, the adaptive threshold is calculated by P=i×Q, where, P is the adaptive threshold, Q is a width of a waveform representing the synchronization head data, and i is a preset percentage.

10. The device according to claim 7, wherein
the glitch processing module is configured to reverse a level of the glitch waveform to be low if the level of the glitch waveform is high, and to reverse a level of the glitch waveform to be high if the level of the glitch waveform is low.

11. The device according to claim 7, wherein the decoding module is configured to decode the first square wave so as to obtain the decoded data, if the determining module determines that there is no glitch waveform in the first square wave.

12. The device according to claim 7, wherein, the adaptive threshold is calculated by P=i×Q, where, P is the adaptive threshold, Q is a width of a waveform representing the synchronization head data, and i is a preset percentage.

13. An intelligent cipher key token, comprising:
an audio interface, configured to receive a sinusoidal wave, wherein the sinusoidal wave has a waveform with at least one period, and different periods represent different bit values; and a processor configured to:
process the sinusoidal wave so as to obtain a first square wave, wherein the first square wave carries data to be decoded;
    determine whether there is a glitch waveform in the first square wave, based on a preset threshold or based on an adaptive threshold, wherein the adaptive threshold is calculated according to synchronization head data carried in the sinusoidal wave;
    if there is a glitch waveform in the first square wave, eliminate the glitch waveform from the first square wave so as to obtain a second square wave; and
    decode the second square wave so as to obtain decoded data.

14. The intelligent cipher key token according to claim 13, wherein the processor is further configured to decode the first square wave so as to obtain the decoded data, if there is no glitch waveform in the first square wave.

15. The intelligent cipher key token according to claim 13, wherein, the adaptive threshold is calculated by $P = i \times Q$, where, P is the adaptive threshold, Q is a width of a waveform representing the synchronization head data, and i is a preset percentage.

16. The intelligent cipher key token according to claim 13, wherein the processor is configured to:
    determine whether there is a waveform with a width less than the preset threshold in the first square wave;
    if there is a waveform with a width less than the preset threshold in the first square wave, determine that there is a glitch waveform in the first square wave; and
    if there is no waveform with a width less than the preset threshold in the first square wave, determine that there is no glitch waveform in the first square wave.

17. The intelligent cipher key token according to claim 13, wherein the processor is configured to:
    determine whether there is a waveform with a width less than the adaptive threshold in the first square wave;
    if there is a waveform with a width less than the adaptive threshold in the first square wave, determine that there is a glitch waveform in the first square wave; and
    if there is no waveform with a width less than the adaptive threshold in the first square wave, determine that there is no glitch waveform in the first square wave.

18. The intelligent cipher key token according to claim 13, wherein the processor is configured to:
    if a level of the glitch waveform is high, reverse the level of the glitch waveform to be low; and
    if a level of the glitch waveform is low, reverse the level of the glitch waveform to be high.

* * * * *